United States Patent
Furuhata et al.

(10) Patent No.: US 7,265,020 B2
(45) Date of Patent: Sep. 4, 2007

(54) SEMICONDUCTOR DEVICE WITH DRAM CELL AND METHOD OF MANUFACTURING THE SAME

(75) Inventors: Takeo Furuhata, Mie (JP); Takahito Nakajima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/235,210

(22) Filed: Sep. 27, 2005

(65) Prior Publication Data

US 2006/0068544 A1 Mar. 30, 2006

(30) Foreign Application Priority Data

Sep. 28, 2004 (JP) ............................. 2004-281936

(51) Int. Cl.
 *H01L 21/8242* (2006.01)
(52) U.S. Cl. .................. 438/386; 438/243; 438/244; 257/301; 257/E21.396; 257/E27.092
(58) Field of Classification Search ............. 438/243, 438/386
See application file for complete search history.

(56) References Cited

U.S. PATENT DOCUMENTS 6,750,111 B2 * 6/2004 Schrems ..................... 438/386

FOREIGN PATENT DOCUMENTS

JP 2003-60079 2/2003

* cited by examiner

*Primary Examiner*—Andy Huynh
*Assistant Examiner*—Dao H. Nguyen
(74) *Attorney, Agent, or Firm*—Oblon, Spivak, McClelland, Maier & Neustadt, P.C.

(57) ABSTRACT

A method of manufacturing a semiconductor device includes forming a trench in a semiconductor substrate, isotropically forming a trench surface insulating film on an inner surface of the trench, the trench surface insulating film including a deep part functioning as a capacitor insulating film, forming a surface layer side insulating film on the inner surface of the trench so that the surface layer side insulating film is continuously rendered thinner from the surface side of the substrate toward the deep side of the trench, and forming an electrode layer inside the surface layer side insulating film and the trench surface insulating film both formed on the inner surface of the trench.

6 Claims, 10 Drawing Sheets

SEMICONDUCTOR DEVICE WITH DRAM CELL AND METHOD OF MANUFACTURING THE SAME

CROSS-REFERENCE TO RELATED APPLICATIONS

This application is based upon and claims the benefit of priority from the prior Japanese Patent Application No. 2004-281936, filed on Sep. 28, 2004, the entire contents of which are incorporated herein by reference.

BACKGROUND OF THE INVENTION

1. Field of the Invention

The present invention relates to a semiconductor device provided with a DRAM cell having a trench capacitor and a method of manufacturing the semiconductor device.

2. Description of the Related Art

A dynamic random access memory (DRAM) cell provided with a trench capacitor comprises a semiconductor substrate formed with a deep trench and a capacitor formed in a deep inside of the trench. Regarding the capacitor, a capacitor insulating film is formed on a deep inside surface of the trench. A first electrode layer is buried inside the capacitor insulating film, whereby the capacitor is fabricated. Furthermore, a second electrode layer is formed on the first electrode layer. A collar insulating film is formed in order to retain an insulation performance between the semiconductor substrate and the first and second electrode layers buried inside the trench.

JP-A-2003-60079 discloses a capacitor manufacturing method. In the disclosed method, a capacitor insulating film, collar insulating film and electrode layer are formed in a trench as follows. Firstly, a deep trench (corresponding to a trench) is formed in a substrate (corresponding to a semiconductor substrate). Subsequent to several steps, a capacitor dielectric layer (corresponding to a capacitor insulating film) is formed on an inner surface of the deep trench. A conductive layer (corresponding to an electrode layer) is formed so as to fill the deep trench. At this time, a gap occurs in the conductive layer. Subsequently, a part of the conductive layer corresponding to an upper portion of the deep trench is removed while a part of the conductive layer corresponding to a bottom of the deep trench.

Furthermore, a colored oxidation layer (corresponding to a collar insulating film) is formed and a colored liner layer made of a material differing from the colored oxidation layer is also formed. A part corresponding to the upper conductive layer is removed. In this case, an oxide is present in the gap. Accordingly, when the conductive layer is formed on the gap, there is a possibility that electric connection cannot be obtained. In view of the possibility, the colored oxidation layer of a part corresponding to the gap is removed.

In the manufacturing method of JP-A-2003-60079, the capacitor dielectric layer is formed as the capacitor insulating film, and the colored oxidation layer and colored liner layer are formed as the collar insulating film. Generally, in the DRAM cell with a trench capacitor, a collar insulating film is formed so as to be thinner than a capacitor insulating film so that an insulating performance is retained between a storage electrode and the semiconductor substrate. The capacitor insulating film needs to be formed to be thinner than the collar insulating film in order that a capacity of the trench capacitor may be increased. As a result, the method disclosed in JP-A-2003-60079 needs to be applied. However, the above-noted manufacturing method results in much trouble and cost increase.

BRIEF SUMMARY OF THE INVENTION

Therefore, an object of the present invention is to provide a semiconductor device in which a manufacturing process can be simplified and a method of fabricating the semiconductor device.

The present invention provides a method of manufacturing a semiconductor device, including forming a trench in a semiconductor substrate, forming a plate diffusion layer in a part of the semiconductor substrate adjacent to the trench, isotropically forming a first insulating film on an entire inside surface of the trench, the first insulating film including a lower portion functioning as a capacitor insulating film, forming a second insulating film on an upper portion of the first insulating film by a plasma oxidation so that a thickness of the second insulating film is decreased gradually toward a bottom of the trench after forming the first insulating film, and forming an electrode layer inside the first-and second insulating films so that the electrode layer is structurally connected to the first and second insulating films.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
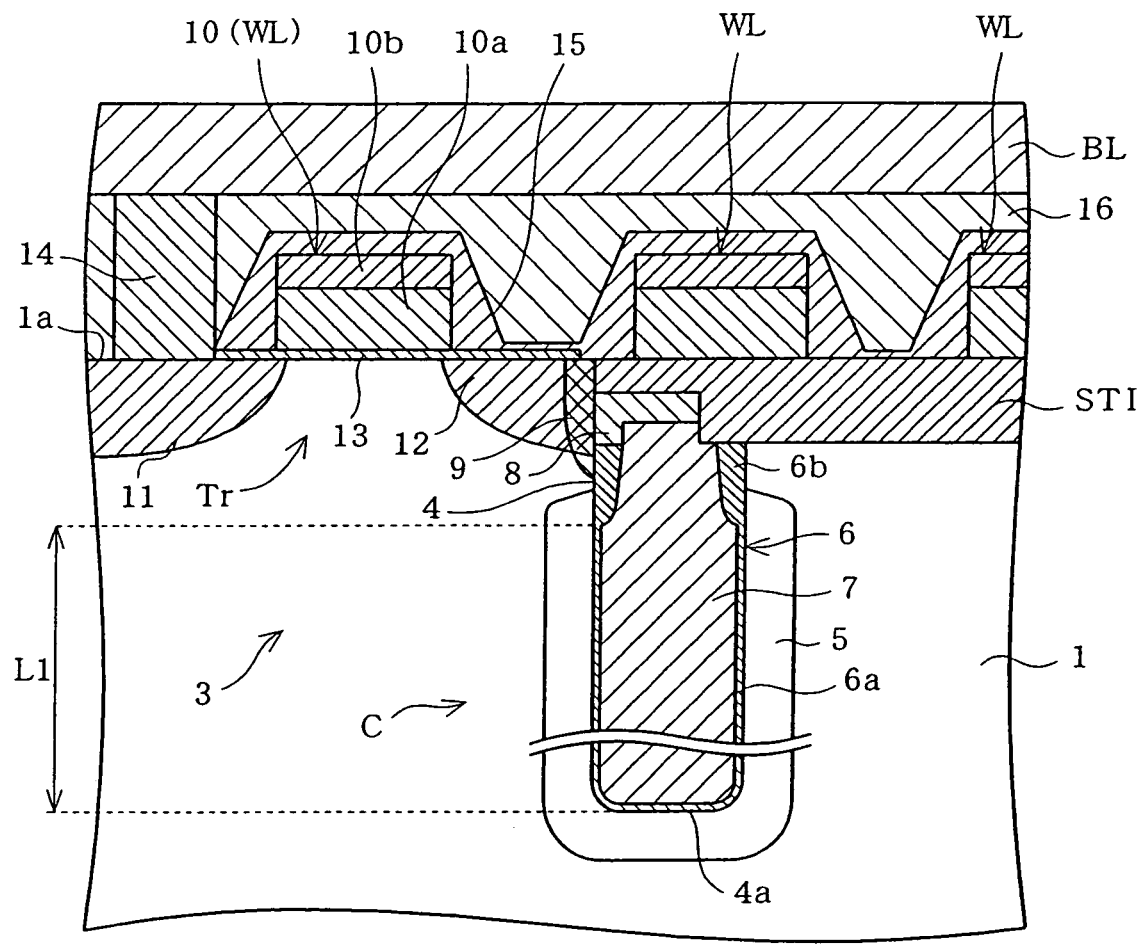
FIG. 1 is a schematic sectional view of a semiconductor device manufactured by a manufacturing method of one embodiment in accordance with the present invention, which view being taken along line 1-1 in FIG. 2.
Figure 2:
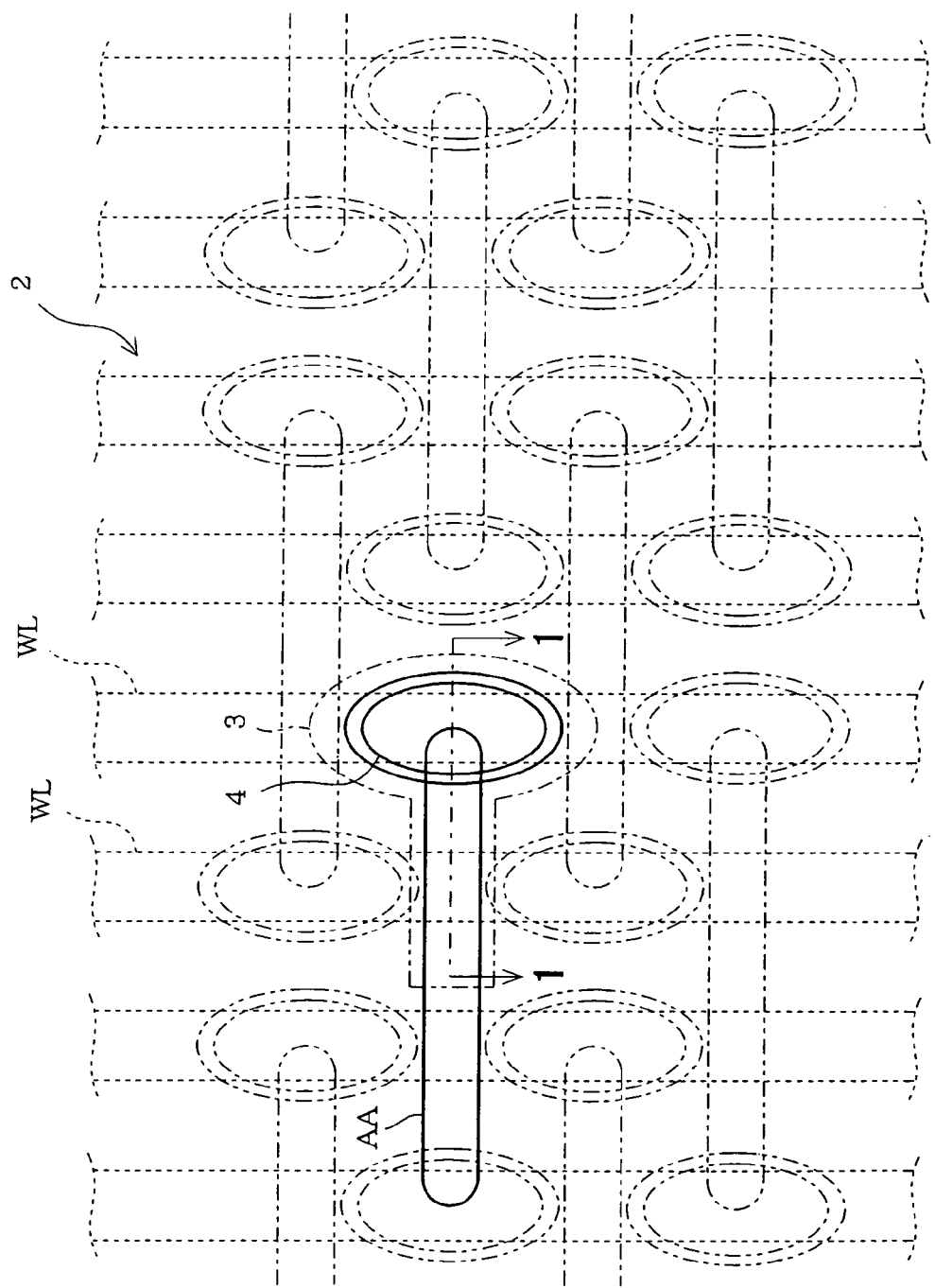
FIG. 2 is a schematic plan view of the semiconductor device.

One embodiment of the present invention will be described with reference to the accompanying drawings. The invention is applied to a DRAM semiconductor storage device provided with a DRAM cell (memory cell) of the trench capacitor type in the embodiment. FIG. 2 is a schematic plan view of a memory cell region of the DRAM semiconductor storage device. FIG. 1 is a schematic sectional view taken along line 1-1 in FIG. 2. In the embodiment, a memory cell 3 is formed on a p-type silicon semiconductor substrate (corresponding to a semiconductor substrate). However, the memory cell 3 may be formed in a p-well region, instead.

<Structure>

Referring to FIG. 2, a DRAM semiconductor storage device 2 as a semiconductor device includes a memory cell region M in which a number of memory cells 3 are arranged on the silicon semiconductor substrate 1. The memory cells 3 are arranged to be paired and opposed to each other in a linear symmetry with respect to a bit line BL (shown in FIG. 1). The memory cells 3 are arranged so that the paired memory cells 3 have a highest degree of integration. An active area AA designates a region including a source/drain diffusion layer of a transistor Tr and a channel region.

Deep trenches 4 (grooves) are provided in a zigzag pattern in the memory cell region M. Each trench 4 is formed into an elliptic shape. Each memory cell 3 comprises a trench capacitor C and a metal oxide semiconductor (MOS) cell transistor Tr as shown in FIG. 1. The trench capacitor C is formed so as to be located at a deep part 4a side of each trench 4. A plate diffusion layer 5 is formed outside the trench 4 so as to be located at the deep part 4a side as shown in FIG. 1. The plate diffusion layer 5 functions as a plate electrode of the trench capacitor C. An insulating film 6 is formed on an inner peripheral face including the deep part 4a side of each trench 4.

A first electrode layer 7 is buried inside the inner peripheral face of each trench 4 and the insulating film 6. The first electrode layer 7 is made from polycrystalline silicon doped with impurities, amorphous silicon doped with impurities or the like. The first electrode layer 7 serves as the other plate electrode (storage node) of the trench capacitor C. A second electrode layer 8 is buried over the first electrode layer 7 in the trench 4 so as to be in contact with a side of the trench 4. The second electrode layer 7 is also made of polycrystalline silicon doped with impurities, amorphous silicon doped with impurities or the like.

The insulating film 6 is made of a silicon nitrided oxide film (SiN—SiO$_2$ film), Al$_2$O$_3$—SiO$_2$ film, HfO$_2$—SiO$_2$ film or the like. The insulating film 6 is formed so that a thickness thereof is gradually reduced from the surface 1a side of the substrate 1 toward a deep part 4a side of the trench 4. In other words, the insulating film 6 is formed so that the thickness thereof is gradually increased from the deep part 4a side of the trench 4 toward the surface 1a side of the substrate 1. The insulating film 6 has a tapered section and includes a part with a predetermined range of height relative to the deep part 4a of the trench 4 (for example, a range from 5 to 10 μm, namely, a region as shown by reference symbol L1 in FIG. 1). This part of the insulating film 6 is isotropically formed so as to have a constant film thickness (4 nm, for example) and referred to as "first forming section 6a." The first forming section 6a serves as a capacitor insulating film for separation of both plate electrodes of the trench capacitor C.

The insulating film 6 is further formed so as to be located over the first forming section 6a. The part located over the first forming section 6a is referred to as "second forming section 6b." The second forming section 6b is formed so as to have a larger thickness than the first forming section 6a. The reason for this is that the first forming section 6a is formed in order to increase a capacity of the trench capacitor C, whereas the second forming section 6b is formed in order to retain the insulation performance between the first and second electrode layers 7 and 8 buried in the trench 4 and the silicon substrate 1. The second forming section 6b is formed so that a thickness thereof is gradually increased from the lower side toward the upper side. The second forming section 6b includes a part which is located on the inner peripheral surface of the trench 4 and has a thickness ranging from 30 to 40 nm, for example.

A shallow trench isolation (STI) structure is provided over the first and second electrode layers 7 and 8 so as to serve as an element isolation region. As shown in FIG. 1, STI is opposed to the cell transistor Tr relative to the trench 4. An insulating film buried in STI is adapted to electrically separate each trench capacitor C from the adjacent trench capacitors. STI further electrically separates each trench capacitor C from a word line WL passing over STI. The second electrode 8 is formed over the first electrode 7 in the trench 4 as described above. Thus, the trench capacitor C comprises the first and second electrodes 7 and 8, the plate diffusion layer 5 and the insulating film 6.

The cell transistor Tr is adjacent to the trench capacitor C so as to electrically be connected to the latter as shown in FIG. 1. A strap 9 is formed on a contact boundary between the cell transistor Tr and the second electrode layer 8 buried inside the trench 4. The strap 9 is formed on an upper part of outer periphery of the trench 4 at the cell transistor Tr side by diffusing donor-type impurities outward from the second electrode layer 8. The cell transistor Tr comprises a gate electrode 10 functioning as a word line WL, n-type diffusion layers 11 and 12 (source/drain diffusion layers) and a gate oxide film 13 (gate insulating film). The gate oxide film 13 is formed on the silicon substrate 1. The gate electrode 10 comprises a polycrystalline silicon layer 10a doped with impurities and formed on the gate oxide film 13 and a metal silicide layer 10b formed on the layer 10a. The diffusion layers 11 and 12 are formed on the surface layer side of the silicon substrate so as to be located at both ends of the gate electrode 10 respectively.

The second electrode layer 8 constituting the trench capacitor C is mechanically in contact with and electrically connected to the diffusion layer 12. A contact plug 14 is mechanically in contact with and electrically connected to the other diffusion layer 11. The contact plug 14 is provided for electrically connecting the diffusion layer 11 to the bit line BL. Furthermore, an insulating film 15 is formed around the gate electrode 10 so as to cover the gate electrode 10. An interlayer insulating film 16 is formed between the bit line BL and the memory cell 3 to electrically separate the bit line BL and the memory cell 3 from each other.

According to the above-described structure, the insulating film 6 includes the first formation section 6a formed on the inner peripheral surface of the trench 4 at the inner deep portion 4a side so that the section 6a has a uniform film thickness. The insulating film 6 further includes the second formation section 6b formed so that the thickness of the section 6b is gradually increased from the predetermined location between the surface 1a of the silicon substrate 1 and the deep portion 4a of the trench 4 toward the surface 1a side of the silicon substrate 1. Accordingly, the insulating film 6 is formed so that the film thickness thereof is gradually increased from the deep portion 4a of the trench 4 toward the surface 1a side of the silicon substrate 1. The first formation section 6a functions as the capacitor insulating film of the trench capacitor C, whereas the second formation section 6b functions as a collar insulating film.

In the foregoing embodiment, the second formation section 6b serving as the collar insulating film is formed into a tapered shape so that a cross-sectional area of the electrode layer is increased from the second electrode layer 8 toward the first electrode layer 7 at the side of the lower portion of the collar insulating film. As a result, the resistance of the electrode layer can be rendered lower and accordingly, the operating speed can be improved. Furthermore, since an upper portion of the collar insulating film is tapered, a path through which impurities in the first electrode layer 7 leaks to an upper portion can be narrowed. As a result, an amount of impurities entering into the silicon substrate 1 side through the second electrode layer 8 can be limited. Consequently, variations in the threshold value of the transistor can be limited, whereupon a memory cell with higher reliability can be formed. Furthermore, since the second formation section 6b serving as the collar insulating film is tapered, an upper part of the collar insulating film is formed on the sidewall of the trench 4 so as to have a larger thickness. Consequently, since impurities in the electrode layers 7 and 8 are prevented from entering through the collar insulating film into the silicon substrate 1, variations in the threshold value of the cell transistor Tr can be limited, whereupon a memory cell with higher reliability can be formed. Additionally, since the second formation section 6b serving as the collar insulating film contains nitrogen (N) atoms, the collar insulating film can be prevented from heat deterioration, whereby the insulating performance can be improved between the first electrode layer 7a and the silicon substrate 1.

<Manufacturing Method>

The method of manufacturing the thus configured trench DRAM semiconductor storage device will now be described with reference to FIGS. 3 to 17. FIGS. 3 to 8 and 10 to 17 are schematic sectional views showing a series of steps of the method of manufacturing the device. Even if the invention can be realized, an order of steps described below can be changed at need. One or a plurality of general steps may be added and one or a plurality of the steps described below may be eliminated.

Figure 3:
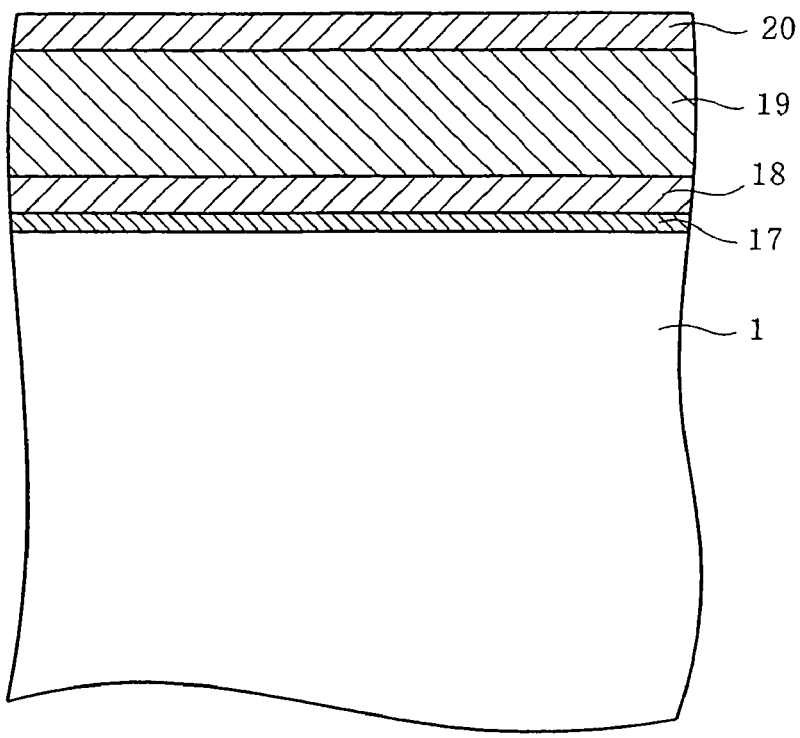
FIG. 3 illustrates a first step of a process of manufacturing a memory cell.

Firstly, the silicon oxide film 17 is formed on the silicon substrate 1 and the silicon nitride film 18 is deposited on the silicon oxide film 17, as shown in FIG. 3. Subsequently, a boron silicate glass (BSG) film 19 is deposited on the silicon nitride film 18. A tetraethyl orthosilicate (TEOS) film 20 serving as a hard mask is further deposited on the BSG film 19.

Figure 4:
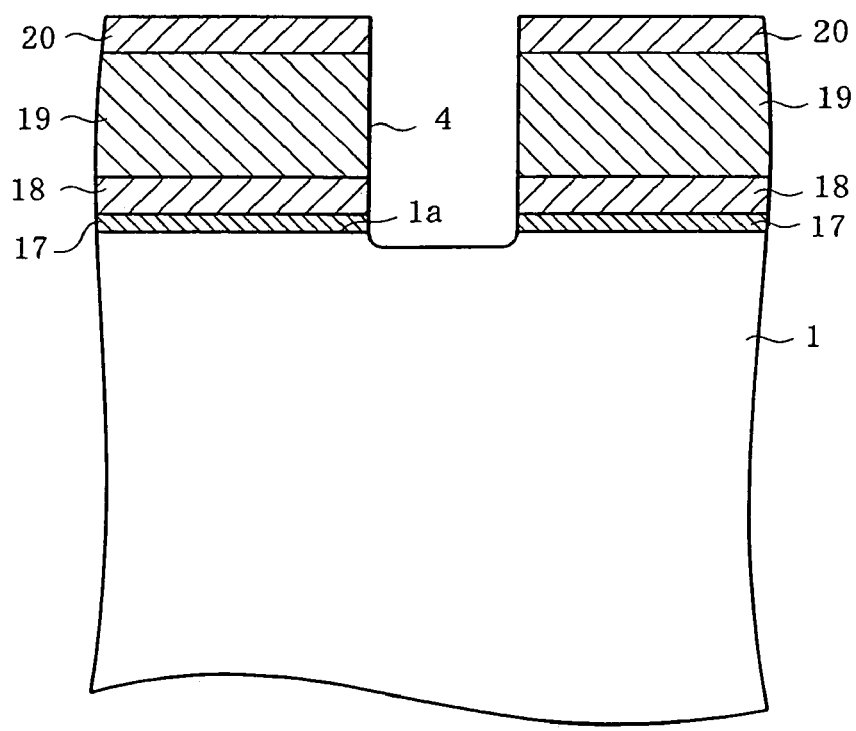
FIG. 4 illustrates a second step of the memory cell manufacturing process

Photoresist (not shown) for forming a deep trench is applied to the TEOS film 20 and then patterned by the photolithography technique as shown in FIG. 4. The silicon oxide film 17, the silicon nitride film 18, the BSG film 19 and the TEOS film 20 are etched by an anisotropic etching process, so that the trench 4 is formed. Thereafter, the resist pattern is removed by ashing.

Figure 5:
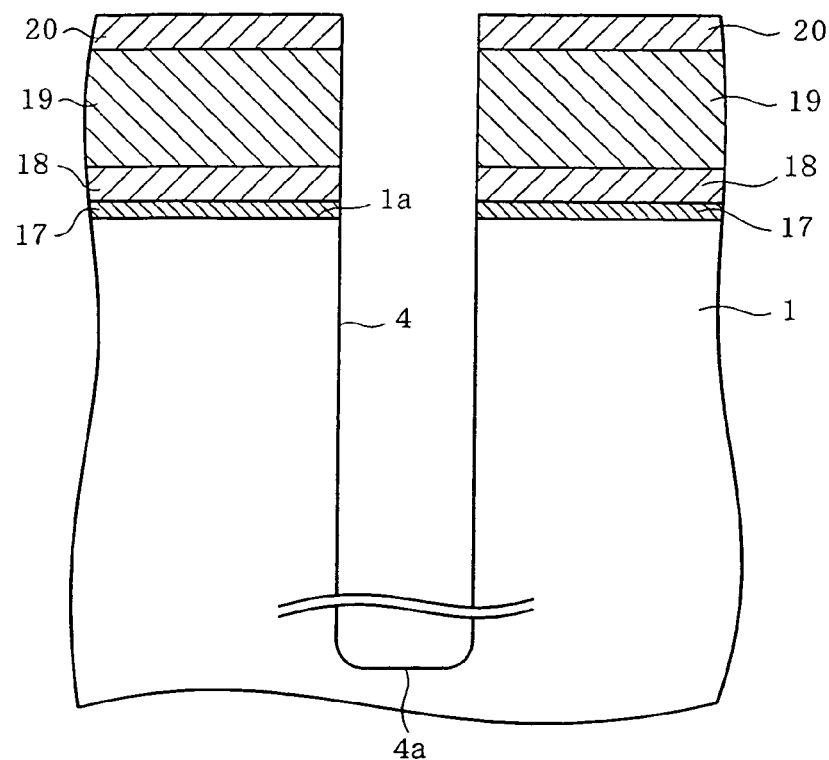
FIG. 5 illustrates a third step of the memory cell manufacturing process.

Subsequently, as shown in FIG. 5, an anisotropic etching (reactive ion etching (RIE)) is carried out with the BSG and TEOS films 19 and 20 serving as masks so that the silicon substrate 1 is etched until a predetermined depth is reached, whereby the deep trench 4 is formed.

Figure 6:
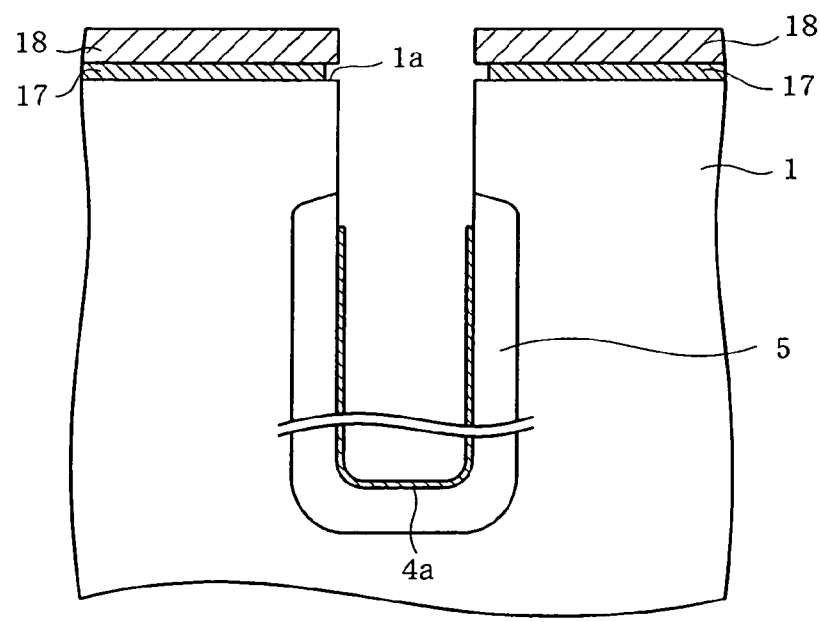
FIG. 6 illustrates a fourth step of the memory cell manufacturing process.
Figure 7:
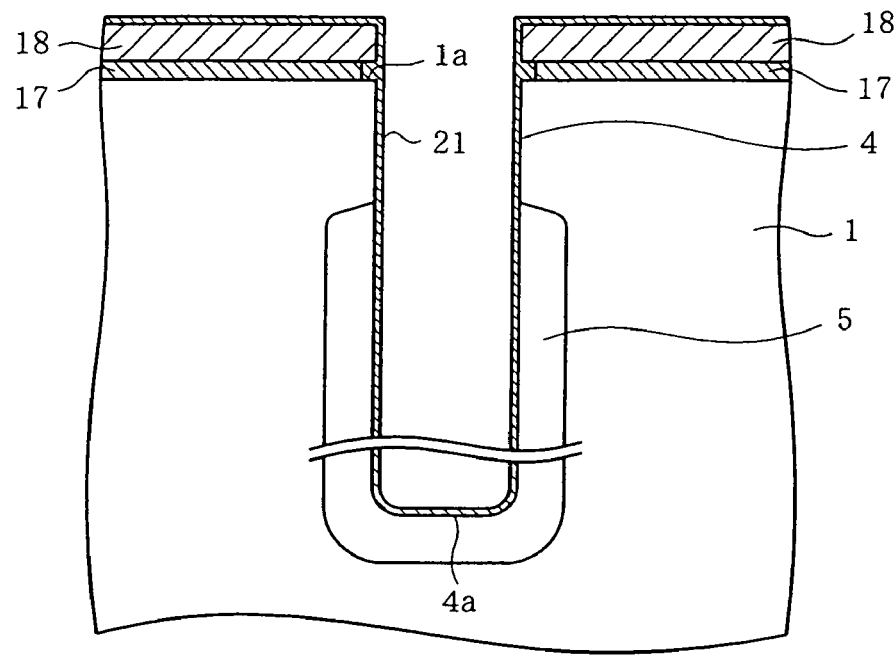
FIG. 7 illustrates a fifth step of the memory cell manufacturing process.
Figure 8:
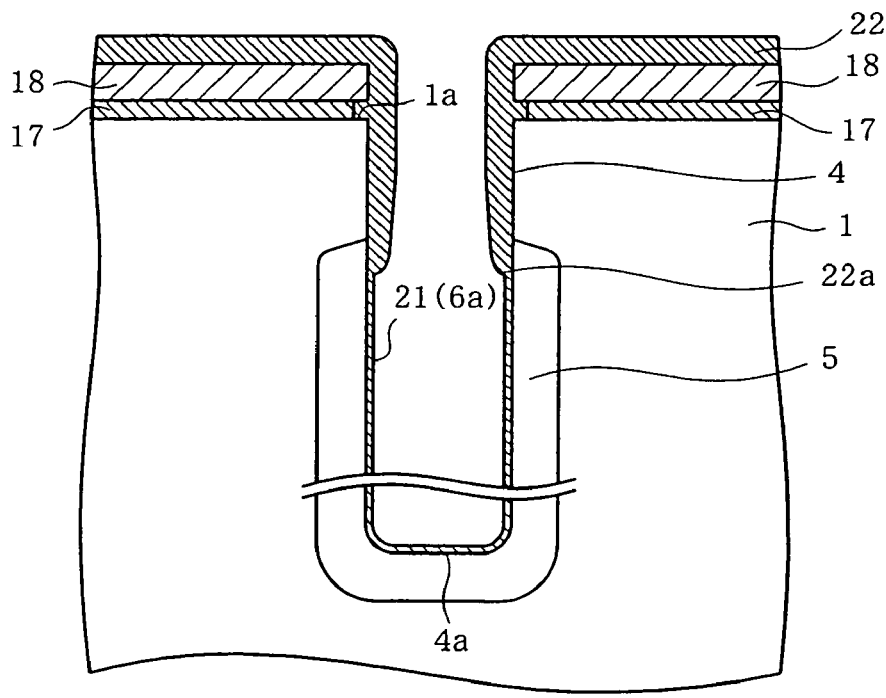
FIG. 8 illustrates a sixth step of the memory cell manufacturing process.

After removal of the BSG film 19, arsenic is diffused from inside the trench 4 over the silicon substrate 1 until a predetermined level (depth) is reached from the deep portion 4a of the trench 4, whereby the plate diffusion layer 5 of the trench capacitor C is formed outside the trench 4, as shown in FIG. 6. Subsequently, the trench surface insulating film 21 is isotropically formed on the inner surface of the trench 4 as shown in FIG. 7. The trench surface insulating film 21 is made from $SiN$—$SiO_2$ film, $Al_2O_3$—$SiO_2$ film, $HfO_2$—$SiO_2$ film or the like. In this case, it is desirable that the trench surface insulating film 21 should contain nitrogen atom. Subsequently, as shown in FIG. 8, a surface layer side insulating film 22 is formed on an upper part of the inner wall of the trench 4 by plasma oxidation (radical oxidation). The conditions for the plasma oxidation are as follows: under the conditions of pressure of 1 Torr, $H_2/O_2/Ar$=10/10/1000 sccm and temperature of 600° C., the plasma oxidation is carried out at 3.5 kW using an electromagnetic wave transmitter whose frequency is 2.45 GHz. The unit sccm is an abbreviation of standard cubic centimeter per minute and a unit of flow rate. Although the temperature is set at 600° C. in the embodiment, the surface layer side insulating film 22 with a desired film thickness can be formed by the plasma oxidation when the temperature ranges from 250° C. to 600° C.

Furthermore, although the plasma oxidation uses a gas with a mixing ratio of $H_2/O_2/Ar$ adjusted as described above in the embodiment, a 100%-$O_2$ gas may be used for the plasma oxidation. Additionally, although the plasma oxidation is carried out in the embodiment, plasma nitriding or combination of plasma oxidation and plasma nitriding may be carried out, instead.

Figure 9:
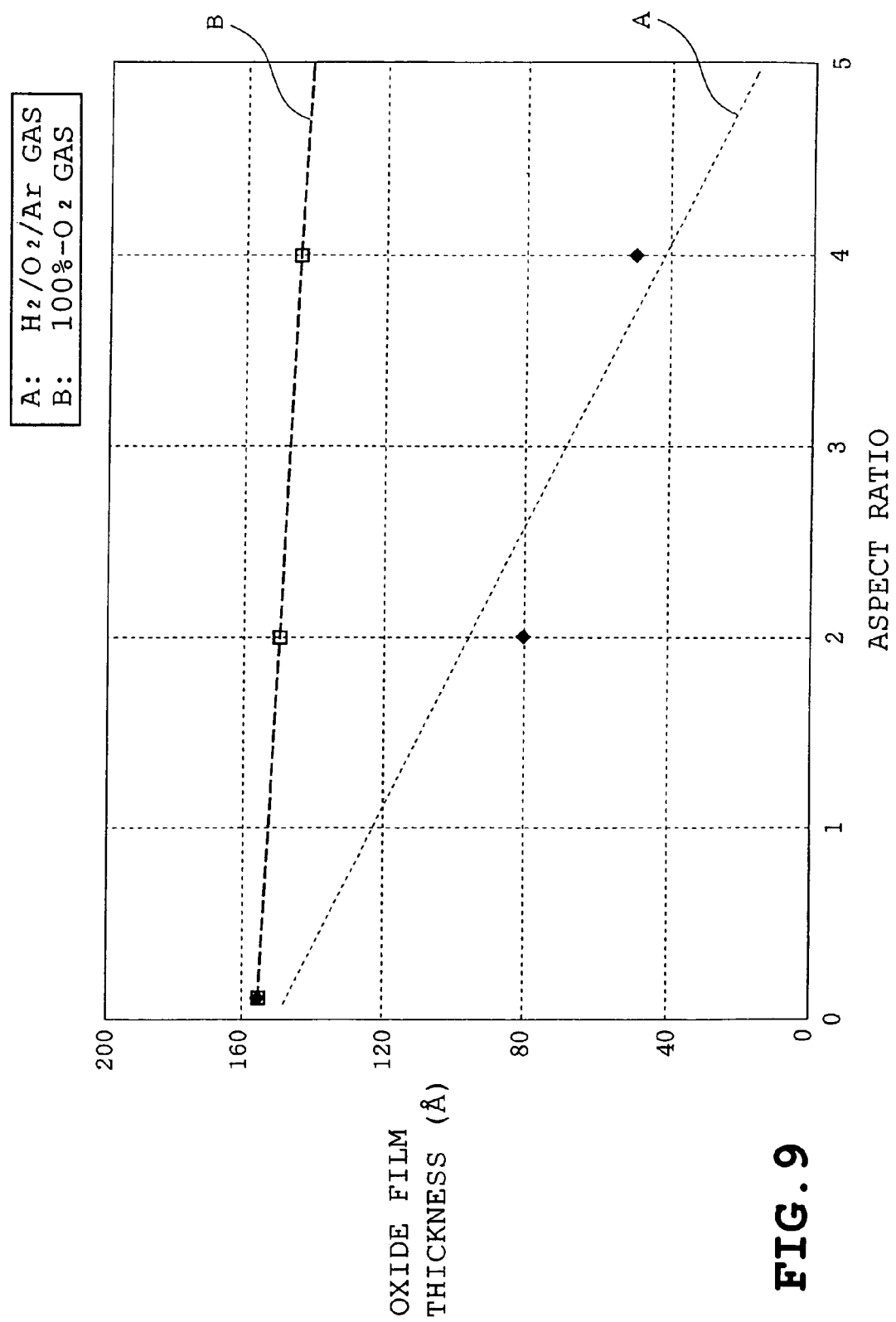
FIG. 9 is a graph showing the relationship between aspect ration and an oxide film thickness.

FIG. 9 shows aspect ratio dependency of the film thickness of a film formed by oxidation when plasma oxidation is carried out for the interior of the trench 4 using the aforesaid two types of gases. As obvious from FIG. 9, whichever gas is used, the film thickness of a film formed by oxidation becomes smaller as an aspect ratio is increased. More specifically, the film thickness of the film formed at a deep location in the trench 4 is smaller than the film thickness of the film formed at a shallow location in the trench 4. Accordingly, the silicon oxide film can be formed from the surface 1a side of the silicon substrate 1 to the deep portion 4a of the trench 4 so as to be continuously thin along the inner surface of the trench.

The aspect ratio dependency of the film thickness of a film formed by oxidation becomes higher when a gas with a mixing ratio of $H_2/O_2/Ar$ is used for plasma oxidation than when a 100%-$O_2$ gas is used for the plasma oxidation. More specifically, the following results were achieved from an experiment conducted by the inventors. When an oxide film is formed using an $H_2/O_2/Ar$ gas, the oxide film has a film thickness of 155 Å at a depth of the trench 4 corresponding to the aspect ratio of 0.1. The oxide film has a film thickness of 80 Å at a depth of the trench 4 corresponding to the aspect ratio of 2. Furthermore, the oxide film has a film thickness of 50 Å at a depth of the trench 4 corresponding to the aspect ratio of 4. See characteristic A in FIG. 9.

On the other hand, when a 100%-$O_2$ gas is used for the plasma oxidation, the oxide film has a film thickness of 155 Å at a depth of the trench 4 corresponding to the aspect ratio of 0.1. The oxide film has a film thickness of 150 Å at a depth of the trench 4 corresponding to the aspect ratio of 2. Furthermore, the oxide film has a film thickness of 145 Å at a depth of the trench 4 corresponding to the aspect ratio of 4. See characteristic B in FIG. 9.

Accordingly, the depth of the trench 4 and the conditions for oxidation are adjusted so that the surface layer side insulating film 22 can be formed so as to be thicker in a portion thereof from the deep portion 4a side of the trench 4 toward the surface 1a side of the silicon substrate 1, as shown in FIG. 8. Furthermore, the film thickness can be controlled. In this forming step in the embodiment, the surface layer side insulating film 22 is formed so that the film thickness thereof becomes zero at a middle location in the trench 4 in the direction of depth of the trench 4. See a lowermost portion 22a of the surface layer side insulating film 22 in FIG. 8. When the surface layer side insulating film 22 is formed by the aforesaid manufacturing method, crystalline anisotropy is reduced in the boundary between the insulating film 6 and the silicon substrate 1. More specifically, since the insulating film 6 and the silicon substrate 1 are brought into a planate contact with each other, electric current leakage due to local concentration of electric field can be reduced, and the memory cell 3 having an improved reliability can be formed.

Figure 10:
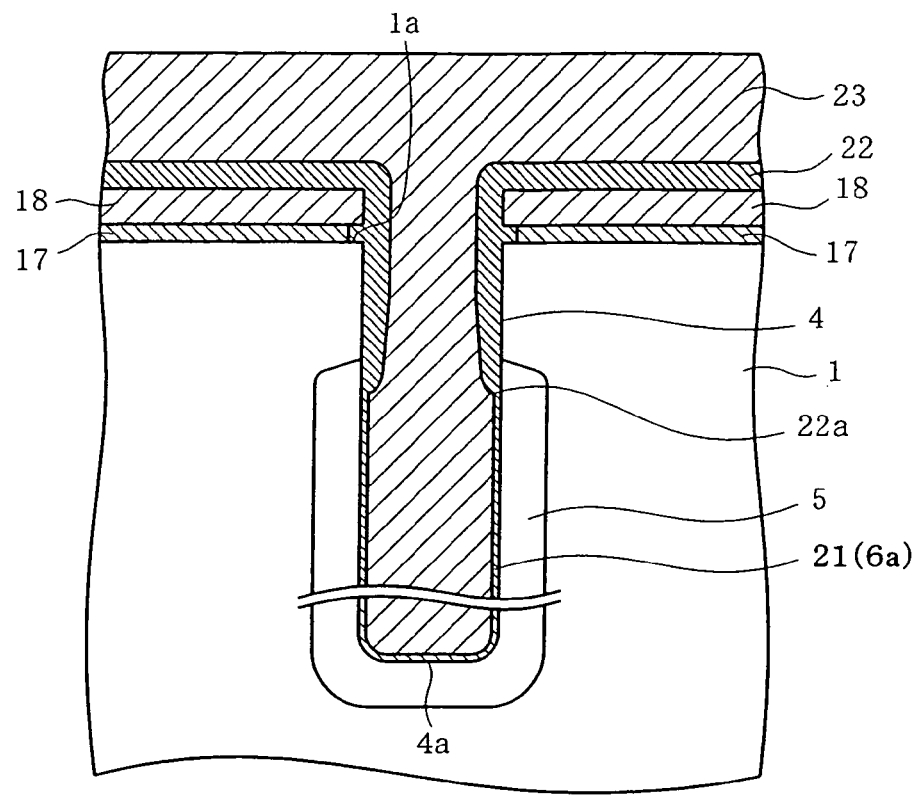
FIG. 10 illustrates an eighth step of the memory cell manufacturing process.
Figure 11:
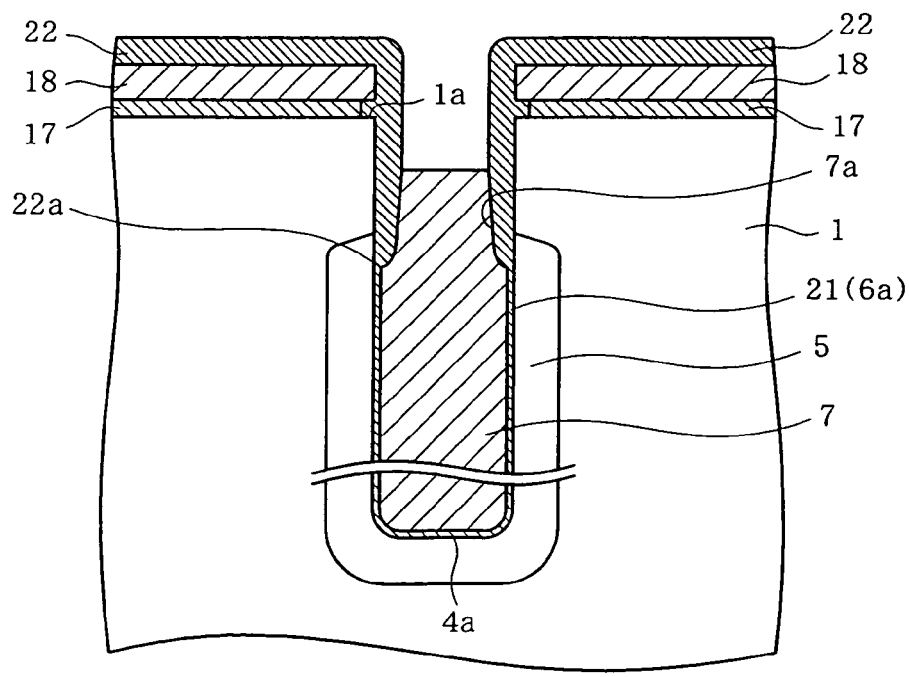
FIG. 11 illustrates a ninth step of the memory cell manufacturing process.

Subsequently, as shown in FIG. 10, a first polycrystalline silicon layer 23 doped with donor impurities is buried inside the trench surface insulating film 21 and surface side insulating film 22 so as to fill the interior of the trench 4 from the deep portion 4a to the surface 1a side of the silicon substrate 1. Subsequently, as shown in FIG. 11, the first polycrystalline silicon layer 23 is etched back by the RIE process until a predetermined level is reached, whereby the first electrode layer 7 is formed. In this case, the etchback is carried out so that the level below the surface 1a of the substrate 1 and above the lowermost portion 22a of the insulating film 22 is reached, whereupon a portion serving as the first electrode layer 7 is formed. In other words, the surface layer side insulating film 22 is formed so as to be in contact with an upper side 7a of the electrode layer 7 upon completion of the step as shown in FIG. 11.

Figure 12:
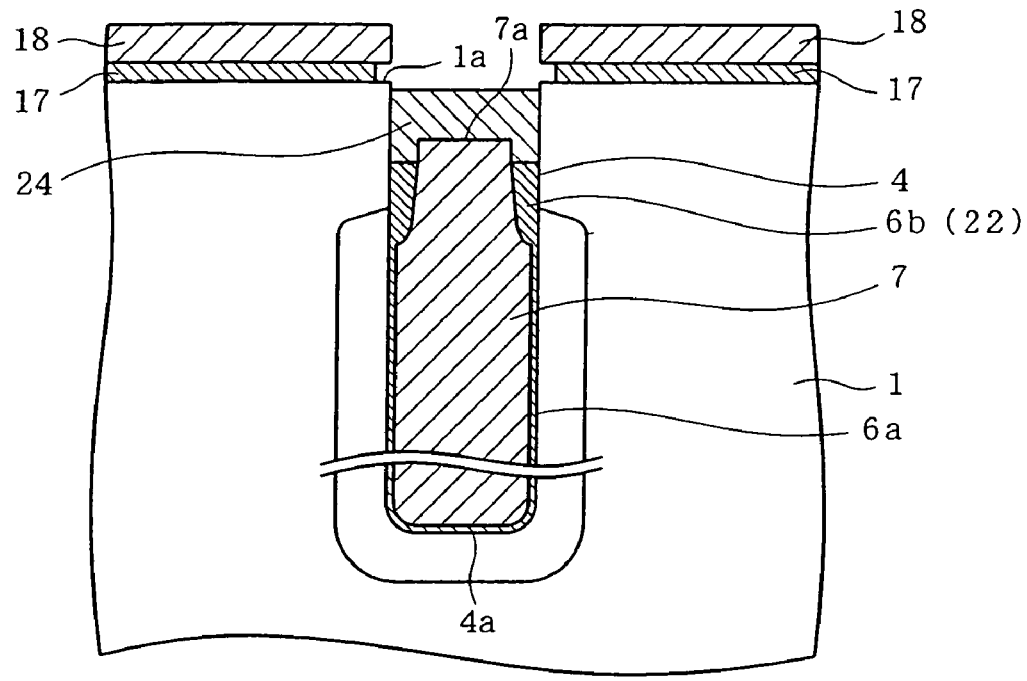
FIG. 12 illustrates a tenth step of the memory cell manufacturing process.
Figure 13:
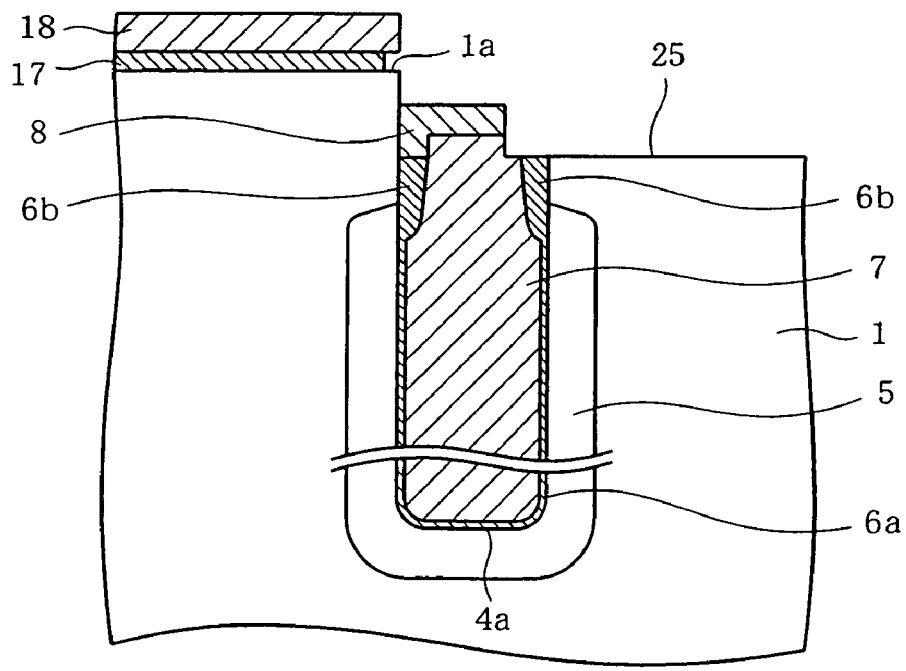
FIG. 13 illustrates an eleventh step of the memory cell manufacturing process.

Subsequently, as shown in FIG. 12, the insulating film 22 formed on the sidewall of the first electrode layer 7 is removed by an isotropic etching process under an etching condition with selectivity for the first electrode layer 7. Since a part of the insulating film 22 at the surface 1a side is removed in FIG. 12, the remainder of the insulating film 22 is designated by reference symbol "6b" which indicates the collar insulating film. In this case, the insulating film 22 formed so as to be in contact with the upper side 7a of the first electrode layer 7 is removed. More specifically, as shown in FIG. 12, the insulating film 22 is removed so that the level below an upper surface of the first electrode layer 7 and above the lowermost portion 22a of the insulating film 22 is reached, whereupon a portion serving as the first electrode layer 7 is formed. As a result, the portion serving as the collar insulating film is formed as shown in FIGS. 12 and 13. Next, ions of for example, Ge and the like are implanted from above the trench 4 for the purpose of adjustment of a threshold (threshold voltage) of the cell transistor Tr. The resultant impurity diffused layer is not shown.

Subsequently, a second polycrystalline silicon layer 24 doped with donor impurities is buried on the first electrode layer 7 and the surface layer side insulating film 22 (the second formation section 6b, the collar insulating film and the collar oxide film) in the trench 4. The second polycrystalline silicon layer 24 is etched back so that a level below the surface 1a of the substrate 1 and above the upper surface of the first electrode layer 7 is reached.

An outer diameter of the trench 4 has recently been reduced and a depth thereof has been increased. Accordingly, when the first polycrystalline silicon layer 23 is buried in the trench 4, the aspect ratio is high such that seams (not shown) are formed in the second polycrystalline silicon layer 24. In the embodiment, however, the collar insulating film (the second formation section 6b) can be formed on the upper surface 7a of the first electrode layer 7 without forming an insulating film on the electrode layer 7. Consequently, no insulating film is buried in the seams. In a conventional method, an insulating film is isotropically formed in the trench 4 before the second polycrystalline silicon layer 24 is buried on the upper side 7a (see FIG. 12) of the first electrode layer 7. Only the insulating film formed on the first electrode layer 7 is removed by the RIE process so that the insulating film remains on the sidewall of the trench 4. The method of the embodiment can form the semiconductor storage device without the aforesaid step of removing the insulating film and accordingly reduce the costs as compared with the above-described conventional method.

Moreover, a good electrical connection can be obtained between the first electrode layer 7 and the second polycrystalline silicon layer 24 since no insulating film is formed between these layers 7 and 24. Consequently, an increase in a contact resistance value can be prevented and failure in write can be reduced. Furthermore, the insulating film 22 is formed at a low temperature before the second polycrystalline silicon layer 24 is buried in the first electrode layer 7. Consequently, outward diffusion of the donor impurities such as arsenic (As) from the first electrode layer 7 (the first polycrystalline silicon layer 23) can be prevented and accordingly, a profile control of the diffusion layer can easily be carried out and accordingly, the memory cell 3 with high reliability can be formed. Additionally, the electrode layer is buried in the trench 4 only twice in the embodiment although the electrode layer needs to be buried in the trench three times in the conventional method.

Figure 14:
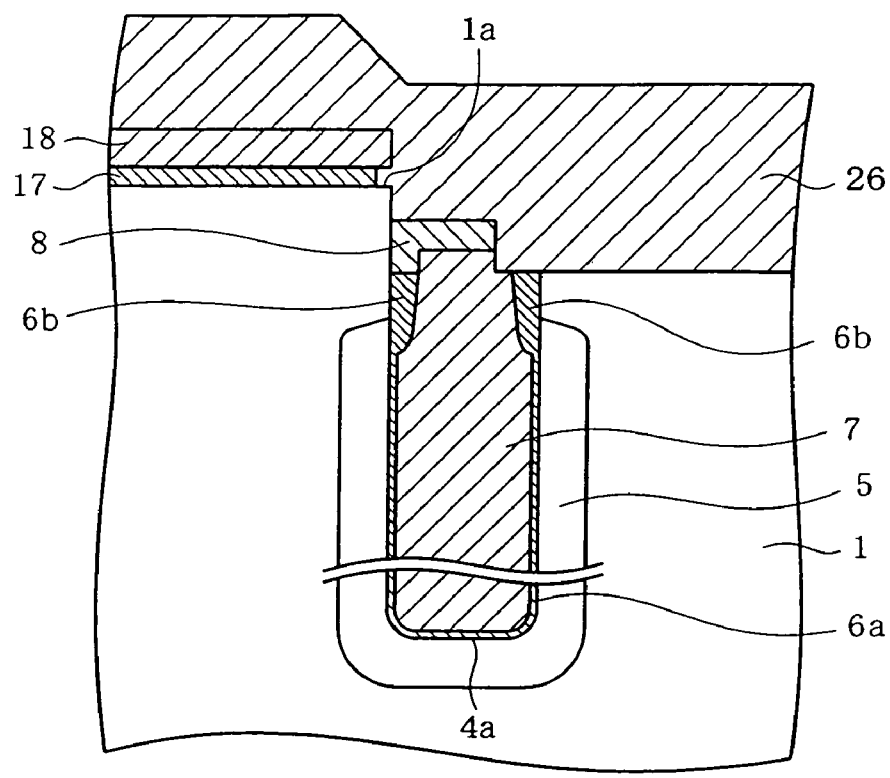
FIG. 14 illustrates a twelfth step of the memory cell manufacturing process.
Figure 15:
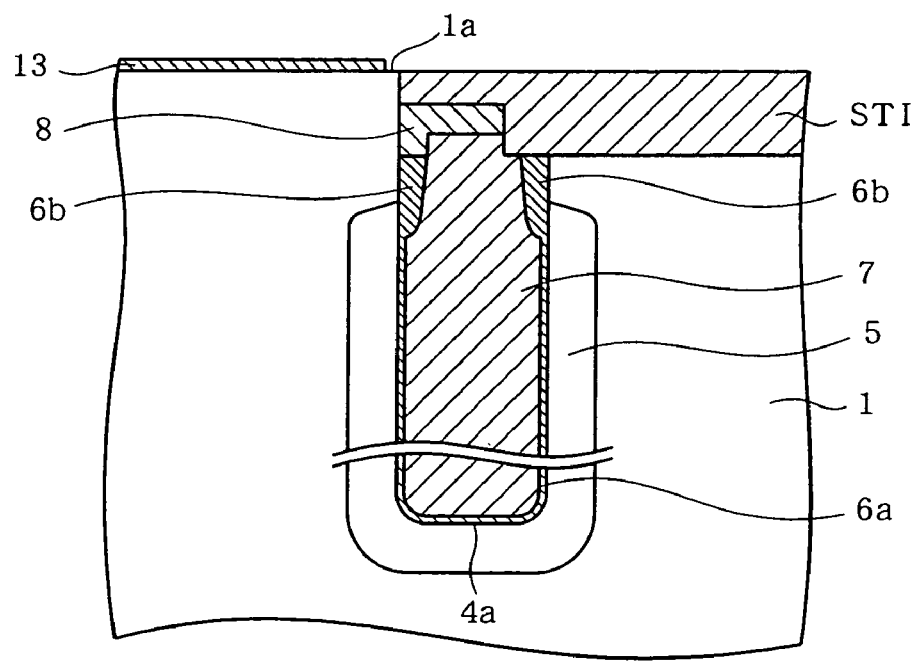
FIG. 15 illustrates a thirteenth step of the memory cell manufacturing process.

Subsequently, resist (not shown) is applied so that a resist pattern is formed by the photolithography technique. Thereafter, as shown in FIG. 13, a groove 25 is formed in the silicon substrate 1, the first electrode layer 7, the second polycrystalline silicon layer 24 and the insulating film 6b by the anisotropic etching process. Subsequently, the TEOS film 26 is deposited as shown in FIG. 14. Furthermore, as shown in FIG. 15, the TEOS film 26 is etched back so that a level near the surface 1a of the silicon substrate 1 is reached, whereby the silicon nitride film 18 used as a hard mask for forming the trench 4 and the silicon oxide film 17 are removed. Next, the silicon oxide film 13 serving as a gate insulating film is formed on the silicon substrate 1.

Figure 16:
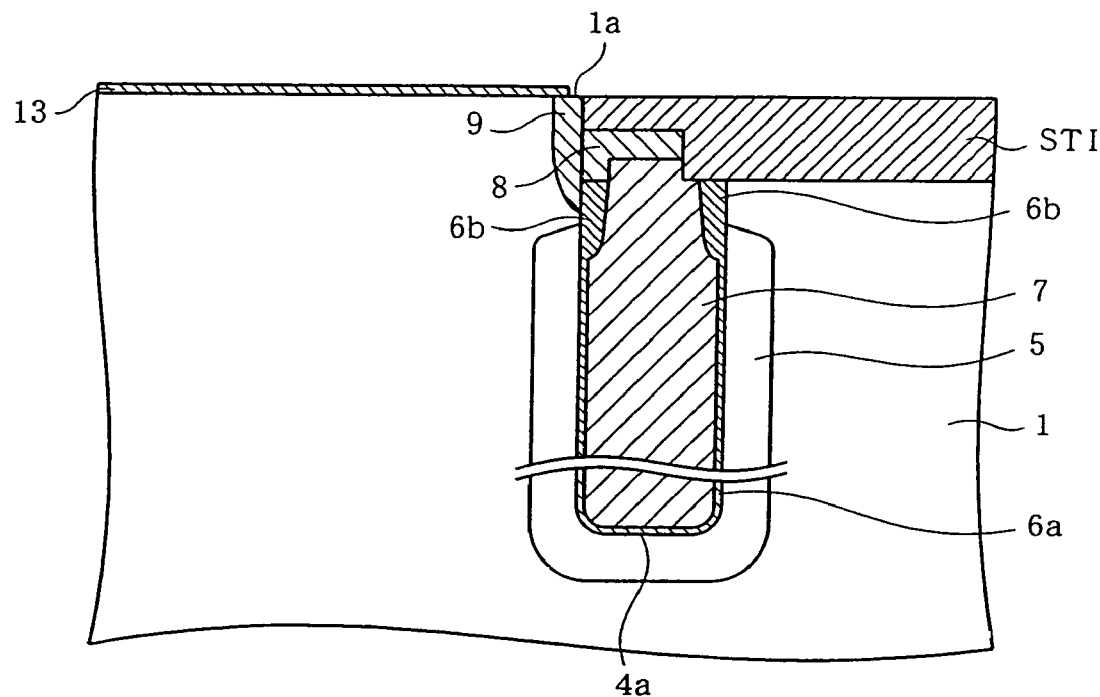
FIG. 16 illustrates a fourteenth step of the memory cell manufacturing process.
Figure 17:
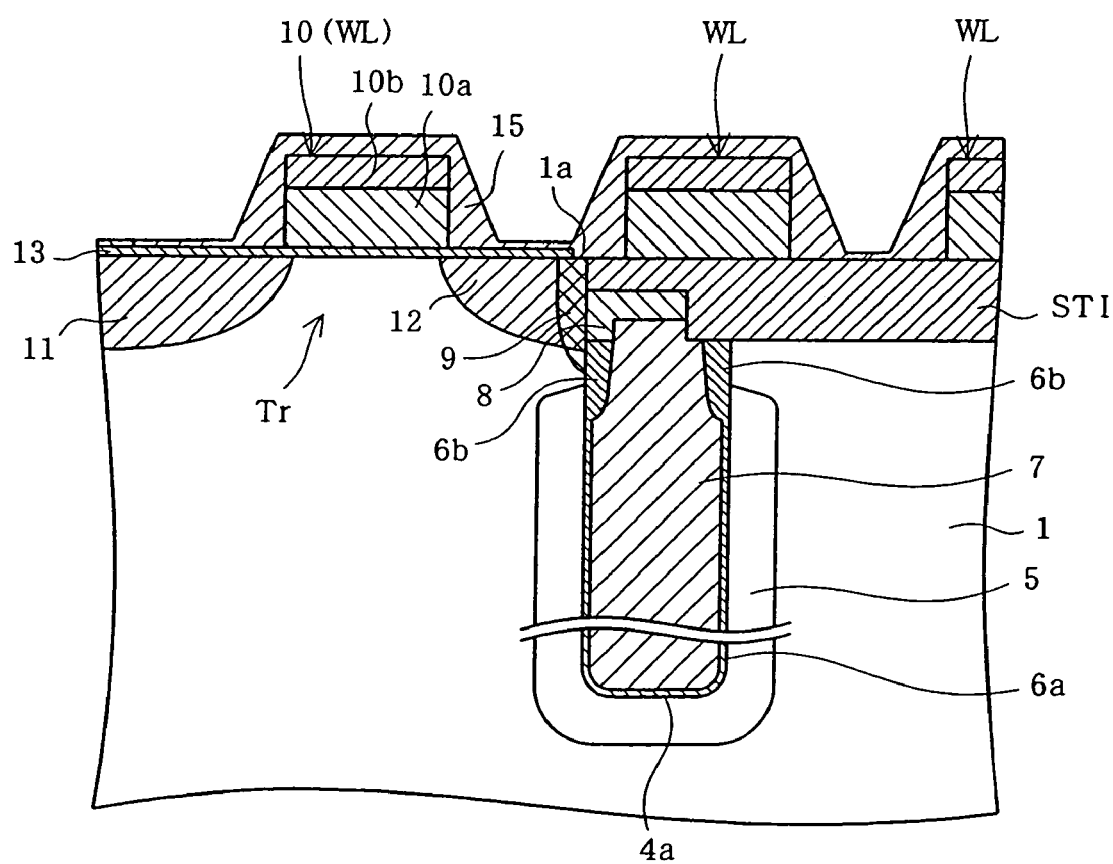
FIG. 17 illustrates a fifteenth step of the memory cell manufacturing process.

Subsequently, as shown in FIG. 16, a high temperature heat treatment is carried out so that the donor impurity (phosphor, arsenic or the like, for example) is diffused outward thereby to be formed into the strap 9. The strap 9 is provided for reducing electrical resistance between the diffusion layer 12 of the cell transistor Tr and the trench capacitor C. Subsequently, as shown in FIG. 17, the gate electrodes 10 of the cell transistor Tr are formed on the silicon oxide film 13 and the STI. The source/drain diffusion layers 11 and 12 are formed on the opposite sides of each gate electrode 10 at the surface layer side of the silicon substrate 1. Further, the sidewall insulating film 15 is formed on the sidewall of each gate electrode 10. In this case, the diffusion layer 12 of the cell transistor Tr is formed so as to be electrically connected to the second electrode layer 8.

Subsequently, as shown in FIG. 1, the interlayer insulating film 16 is buried on the sidewall insulating film 15 formed on the sidewall of each gate electrode 10. The interlayer insulating film 16 is then etched so that a part of the interlayer insulating film 16 on the diffusion layer 11 composing the cell transistor Tr is removed, whereby a contact hall is formed. A barrier metal layer (not shown) and an electrode layer (not shown) are formed in the contact hall, whereby the contact plug 14 is formed.

Subsequently, the bit line BL serving as upper layer winding comprising a titan (Ti) film, tungsten (W) film and the like is formed on the contact plug 14. As a result, the contact plug 14 electrically connects the diffusion layer 11 and the bit line BL together.

According to the above-described manufacturing method, the trench surface insulating film 21 is isotropically formed so as to extend from the surface 1a side of the silicon substrate 1 toward the deep portion 4a of the trench 4. The trench surface insulating film 21 is further formed so that the first formation section 6a at the deep portion 4a side serves as the capacitor insulating film. The plasma oxidation and plasma nitriding are carried out so that the trench surface insulating film 21 is rendered thin continuously from the surface 1a side of the silicon substrate 1 toward the deep portion 4a of the trench 4 in the trench 4, whereby the surface side insulating film 22 is formed. The first polycrystalline silicon layer 23 (electrode layer) is buried inside the insulating films 21 and 22 both formed on the inner surface of the trench 4. The first polycrystalline silicon layer 23 is then etched back so that the first electrode layer 7 is formed.

According to the foregoing embodiment, even when seams (not shown) are formed in the first electrode layer 7, the second formation section 6b as the collar insulating film can be formed on the upper inner sidewall of the trench 4 without an insulating film on the first electrode layer 7. Consequently, the memory cell 3 of the trench DRAM can readily be formed. Moreover, since the memory cell can be configured without any insulating film on the first electrode layer 7, the electrical contact resistance can be restrained between the first and second electrode layers 7 and 8.

In a modified form of the embodiment, the invention is applied to the p-type silicon substrate in the foregoing embodiment. However, any type of semiconductor substrate may be used. In another modified form, the invention may be applied to a general purpose DRAM, custom DRAM or any device having a DRAM area together with another circuit area.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended

What is claimed is:

1. A method of manufacturing a semiconductor device, comprising:
    forming a trench in a semiconductor substrate;
    forming a plate diffusion layer in a part of the semiconductor substrate adjacent to the trench;
    isotropically forming a first insulating film on an entire inside surface of the trench, the first insulating film including a lower portion functioning as a capacitor insulating film;
    forming a second insulating film on an upper portion of the first insulating film by a plasma oxidation so that a thickness of the second insulating film is decreased gradually toward a bottom of the trench after forming the first insulating film; and
    forming an electrode layer inside the first and second insulating films so that the electrode layer is structurally connected to the first and second insulating films.

2. The method according to claim 1, wherein the plasma oxidation uses a mixed gas of oxygen, hydrogen and argon.

3. The method according to claim 1, wherein the plasma oxidation uses an oxygen gas.

4. The method according to claim 1, wherein a lower end of the second insulating film is lower than an upper end of the plate diffusion layer relative to the upper surface of the semiconductor substrate.

5. A method of manufacturing a semiconductor device, comprising:
    forming a trench in a semiconductor substrate;
    forming a plate diffusion layer in a part of the semiconductor substrate adjacent to the trench;
    isotropically forming a first insulating film on an entire inside surface of the trench, the first insulating film including a lower portion functioning as a capacitor insulating film;
    forming a second insulating film on an upper portion of the first insulating film by a plasma nitrization so that a thickness of the second insulating film is decreased gradually toward a bottom of the trench after forming the first insulating film; and
    forming an electrode layer inside the first and second insulating films so that the electrode layer is structurally connected to the first and second insulating films.

6. The method according to claim 5, wherein a lower end of the second insulating film is lower than an upper end of the plate diffusion layer relative to the upper surface of the semiconductor substrate.

* * * * *